United States Patent [19]

Takahashi et al.

[11] Patent Number: 4,910,679
[45] Date of Patent: Mar. 20, 1990

[54] STEP-AND-REPEAT ALIGNMENT AND EXPOSURE METHOD AND APPARATUS

[75] Inventors: Kazuo Takahashi, Kawasaki; Masao Kosugi, Yokohama, both of Japan

[73] Assignee: Canon Kabushiki Kaisha, Tokyo, Japan

[21] Appl. No.: 337,654

[22] Filed: Apr. 13, 1989

Related U.S. Application Data

[60] Division of Ser. No. 237,620, Aug. 24, 1988, Pat. No. 4,843,563, which is a continuation of Ser. No. 843,219, Mar. 24, 1986, abandoned.

[30] Foreign Application Priority Data

Mar. 25, 1985 [JP] Japan ............................... 60-058535
Apr. 30, 1985 [JP] Japan ............................... 60-090891

[51] Int. Cl.$^4$ ..................... G01B 11/00; H01L 12/30
[52] U.S. Cl. ..................... 364/490; 364/489; 364/488; 250/492.2; 250/492.2
[58] Field of Search ................... 364/488–491, 364/571.01, 571.05, 559; 250/491.1, 492.21, 492.22, 492.24; 356/400, 401; 362/327

[56] References Cited

U.S. PATENT DOCUMENTS

| | | | |
|---|---|---|---|
| 4,063,103 | 12/1977 | Sumi | 250/442.1 |
| 4,103,998 | 8/1979 | Nakazawa et al. | 364/490 |
| 4,291,231 | 9/1981 | Kawashima et al. | 250/442.1 |
| 4,410,800 | 10/1983 | Yoshikawa | 250/442.1 |
| 4,418,467 | 12/1983 | Iwai | 250/442.1 |
| 4,553,834 | 11/1985 | Avata et al. | 364/184 |
| 4,558,225 | 12/1985 | Gotou et al. | 250/442.1 |
| 4,615,621 | 10/1986 | Allen et al. | 350/400 |
| 4,627,010 | 12/1986 | Kosugi | 356/400 |
| 4,672,557 | 6/1987 | Tamura et al. | 364/490 |
| 4,723,221 | 2/1988 | Matsuura et al. | 364/490 |

FOREIGN PATENT DOCUMENTS

| | | | |
|---|---|---|---|
| 0033832 | 4/1981 | Japan | 250/442.1 |
| 0054319 | 3/1982 | Japan | 250/442.1 |
| 0096527 | 6/1982 | Japan | 250/442.1 |
| 0127325 | 7/1983 | Japan | 250/442.1 |
| 0027525 | 2/1984 | Japan | 250/442.1 |

OTHER PUBLICATIONS

Asai et al. "Distortion Correction and Deflection Calibration by Means of Laser Interferonvetry in an Electron-Beam Exposure System", J. Vac. Sci. Technol., vol. 16, No. 6, Nov./Dec. 1979, pp. 1710–1713.

Primary Examiner—Parshotam S. Lall
Assistant Examiner—V. N. Trans
Attorney, Agent, or Firm—Fitzpatrick, Cella, Harper & Scinto

[57] ABSTRACT

An exposure apparatus usable in the manufacture of semiconductor devices, for transferring a pattern of a reticle onto each of discrete areas of a semiconductor wafer in a step-and-repeat manner. The apparatus has a laser interferometer for precisely measuring the amount of displacement of the wafer and a memory for storing positional errors of the shot areas, relative to respective target positions, established at the time of completion of the stepwise movements of the wafer. In accordance with the stored positional errors and with the result of measurement by the laser interferometer, the amount of stepwise movement of the wafer is corrected, whereby the accuracy of step-feed for the wafer is improved without decreasing the throughput. In another aspect, the exposure apparatus is provided with a TTL detection system for detecting the positional error of each of the shot areas relative to a target or reference shot area established at the time of completion of stepwise movement of the wafer. If a variation component of the positional error detected by way of the TTL detecting system is not less than a predetermined level, the positioning of the wafer is effected for each of the shot areas, by use of the TTL detecting system. If the variation component is less than the predetermined level, the positioning of the wafer or each shot area is effected on the basis of the measurement by the laser interferometer.

3 Claims, 7 Drawing Sheets

STEP-AND-REPEAT ALIGNMENT AND EXPOSURE METHOD AND APPARATUS

This application is a division of application Ser. No. 237,620 filed Aug. 24, 1988, now U.S. Pat. No. 4,843,563, which is a continuation of application Ser. No. 843,219, filed on March 24, 1986, abandoned.

FIELD OF THE INVENTION AND RELATED ART

This invention relates to an alignment and exposure method and apparatus, and, more particularly, to a step-and-repeat alignment and exposure method and apparatus particularly suitable for use in the manufacture of semiconductor devices (integrated circuits, etc.) or the like.

Step-and-repeat type alignment and exposure apparatuses, called steppers, have been used in the manufacture of semiconductor devices. As is well-known in the art, the exposure apparatus of this type is arranged such that an image of a pattern formed on a reticle is projected by a projection lens, in a reduced scale, onto a semiconductor wafer placed under the projection lens, while the semiconductor wafer is moved stepwise or intermittently, whereby discrete areas on the wafer are sequentially exposed to the images of the pattern of the reticle with a radiation such as light. By this, images of the pattern of the reticle are respectively transferred onto the discrete areas of the wafer.

Recent enormous progress in the density of semiconductor integrated circuits and the resultant miniaturization of the circuit patterns have enforced further improvements in the overlay or alignment accuracy of the reticle and the wafer during the pattern transfer operation. And, currently, alignment accuracy of an order of 0.02 micron is required, as compared with conventionally required alignment accuracy of an order of 0.1 micron.

Such high overlay or alignment accuracy can be effectively attained by a die-by-die alignment method, according to which the relative position of the reticle and the wafer is adjusted each time one of the discrete areas of the wafer is going to be exposed to the pattern of the reticle with the radiation. According to this method, however, the throughput of the exposure apparatus can not be so high because a relatively long time is required for processing each "shot". As compared therewith, a higher throughput is attainable by a global alignment method. According to this method, the position of the wafer, as a whole, relative to the reticle is adjusted only once, prior to the initiation of the exposure of the first shot of the wafer (one of the discrete areas of the wafer which should be exposed to the reticle pattern first). Once the position of the wafer as a whole relative to the reticle is adjusted, the step-feeding or stepwise movement of the wafer for the sake of repetition of exposure relative to the discrete areas of the wafer is controlled by monitoring the wafer displacement by use of a laser interferometer or other measuring means. While a higher throughput is attainable with this global alignment method, the overlay or alignment accuracy is not so high as compared with that attainable by the die-by-die alignment method. As a compromise between the die-by-die alignment method and the global alignment method, a zone alignment method has been proposed. In this method, the relative position of the reticle and the wafer is adjusted, once, for plural ones of the discrete areas of the wafer. As will be understood, the throughput and the overlay or alignment accuracy attainable with this method will be of medium level, as compared with those attainable by the die-by-die alignment method and the global alignment method.

SUMMARY OF THE INVENTION

It is accordingly a primary object of the present invention to provide an exposure method and apparatus by which both a satisfactorily high throughput and a satisfactorily high overlay or alignment accuracy are attainable.

Briefly, according to the present invention, there is provided an alignment and exposure method, comprising effecting exposures relative to a first object in a step-and-repeat manner, detecting a positional error of each of actually exposed areas on the first object with respect to corresponding one of reference positions set for the first object, and effecting exposure relative to a second object in the step-and-repeat manner while adjusting the amount of stepwise movement of the second object in accordance with the detection of the positnal error.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
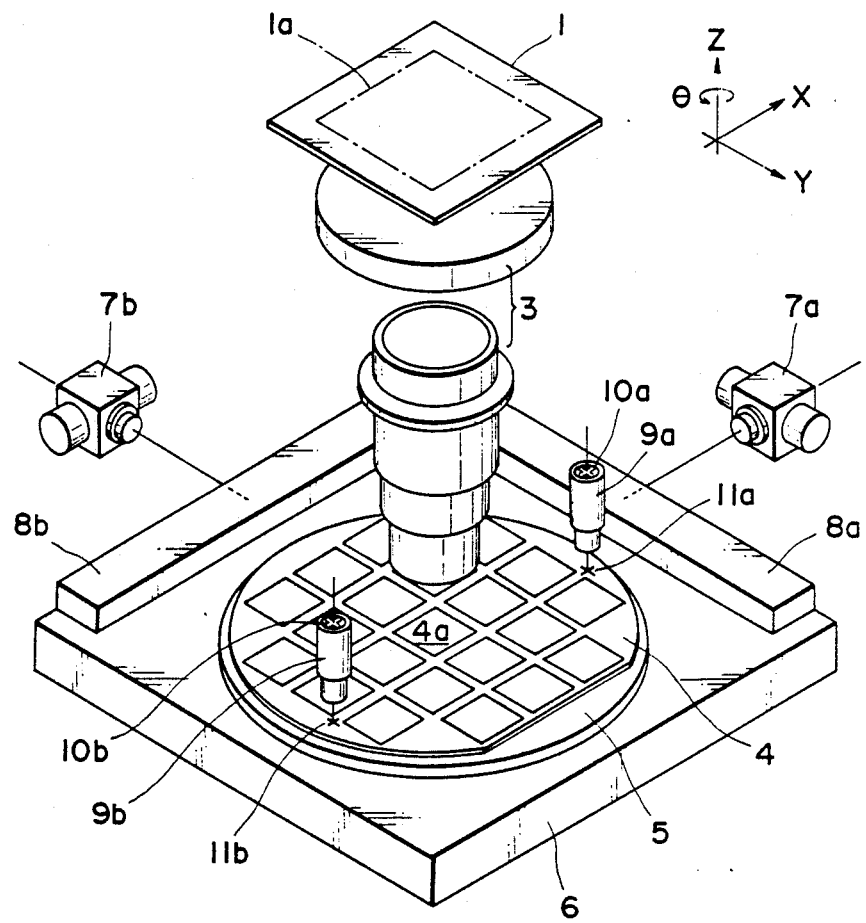
FIG. 1 is a schematic and perspective view of an exposure apparatus according to an embodiment of the present invention.

Referring first to FIG. 1, there is shown an exposure apparatus of step-and-repeat type, according to an embodiment of the present invention. In FIG. 1, a reticle 1 has an integrated circuit pattern 1a formed on a lower surface thereof. The reticle 1 is held at the illustrated position by a reticle stage 2 which is diagrammatically shown in FIG. 2. Denoted generally by numeral 3 is a projection optical system which is provided to project an image of the pattern 1a of the reticle 1 onto a surface of a semiconductor wafer 4 held by a wafer chuck 5. The exposure apparatus further includes an illumination system 29 which is diagrammatically shown in FIG. 2. The illumination system 29 supplies a light beam of a predetermined wavelength or wavelengths to illuminate the pattern 1a of the reticle 1. When the reticle pattern 1a is irradiated with the light from the illumination system 29, one of discrete areas 4a on the wafer 4 surface is exposed to the light passed through the reticle pattern 1a and through the projection optical system 3, whereby the image of the pattern 1a is transferred onto the one area of the wafer 4. In this embodiment, the projection optical system 3 comprises a projection lens system having a reduced magnification.

The wafer chuck 5 holding the wafer 4 is movable in each of a Z-axis direction and a θ (rotational) direction. The wafer chuck 5 is supported by a wafer stage 6 which is movable in each of an X-axis direction and a Y-axis direction. Laser interferometers 7a and 7b are provided to measure the amount of displacement of the wafer stage 6 in the X and Y directions. Mounted on the wafer stage 6 are mirrors 8a and 8b which are cooperative with the laser interferometers 7a and 7b, respectively, to detect the displacement of the wafer stage 6. The exposure apparatus further includes an off-axis alignment microscope system having a pair of objective lenses 9a and 9b. These objective lenses 9a and 9b are spaced from each other so that they can observe and detect, at the same time, a pair of off-axis alignment marks 11a and 11b which are formed on the wafer 4 surface with a predetermined distance maintained therebetween. These off-axis alignment marks 11a and 11b are provided for the sake of off-axis alignment of the wafer 4, not using the projection optical system 3. As shown in FIG. 1, each of the objective lenses 9a and 9b is formed with a reference mark 10a or 10b which is provided to detect any positional deviation of the alignment mark 11a or 11b with respect to the reference position as represented by the reference mark 11a or 11b.

Figure 2:
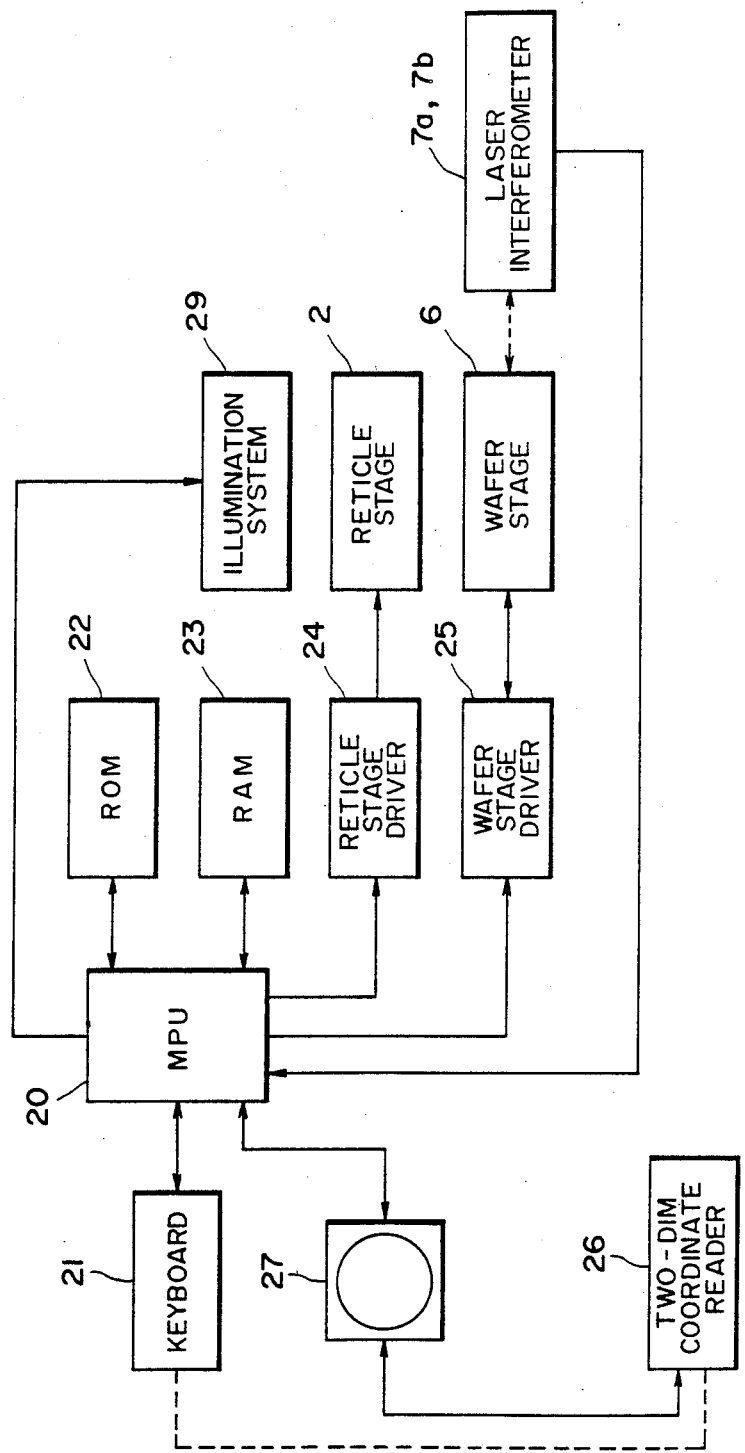
FIG. 2 is a block diagram showing the arrangement of a control system used in the FIG. 1 embodiment.

Referring now to FIG. 2 showing the arrangement of a control system of the present embodiment, the exposure apparatus includes a microprocessor (MPU) 20, a keyboard 21, a read-only-memory (ROM) 22, a random access memory (RAM) 23, a reticle stage driver 24 for driving the reticle stage 2, and a wafer stage driver 25 for driving the wafer stage 6. Denoted by numeral 26 in this Figure is a two-dimensional coordinate reader of known type, such as an optical interference type coordinate detector, a scanning electron microscope or the like. Denoted by numeral 27 is a non-volatile memory.

The microprocessor 20 is provided to control various operations in the exposure apparatus, such as the alignment operation, the exposure operation, the step-feeding or stepwise movement of the wafer, etc. The keyboard 21 is provided to supply or input, into the apparatus, various operation-instructing signals and various data necessary for performing the operations. The read-only-memory 22 is provided to store therein control programs for the microprocessor 20. The random access memory 23 is provided to temporarily store various data which are supplied when the microprocessor 20 carries out the control programs. In a portion of the random access memory 23, there is defined an area in which a positional error table, containing data about the positional errors of patterns actually transferred onto the wafer relative to respective target or aimed positions, is to be stored. As will be described later, these data contained in the positional error table is used for the sake of correction of the amount of stepwise movement of the wafer stage, with respect to each of the discrete areas of the wafer.

The two-dimensional coordinate reader 26 is provided to precisely detect the position of each of the patterns printed on a reference wafer, details of which will be described later. Also, the non-volatile memory 27 is provided to store therein the results of measurement by the two-dimensional coordinate reader 26 and the data input from the keyboard 21, as well as a necessary portion of the data supplied from the microprocessor 20 (such as, for example, an approximation faction which will be described later). In this embodiment, the two-dimensional coordinate reader 26 is electrically connected to the microprocessor 20 by way of the non-volatile memory 27. However, this is not indispensable, and the two-coordinate reader 26 may be disconnected. In such case, an operator will read the position of each of the patterns printed on the reference wafer by use of the isolated two-dimensional coordinate reader 26, and then manually input, into the apparatus, the data about the results of position-detection, the data about the errors of the positions of the patterns with reference to respective aimed positions or the data concerning the approximation function, by use of the keyboard 21.

Referring back to FIG. 1, the wafer 4 is placed on the wafer chuck 5 at an unshown wafer loading/unloading station. Then, the wafer 4 is conveyed to a position under the projection optical system 3. In the course of wafer transportation, the wafer 4 is subjected to a prealignment operation by means of an unshown TV prealignment system, so that the wafer 4 is placed under the projection optical system 3 only with a positional error of an order not greater than ±10 microns. Thus, upon completion of wafer transportation, the alignment marks 11a and 11b formed on the wafer 4 come into respective viewfields of the objective lenses 9a and 9b. On the basis of positional signals obtainable from the objective lenses 9a and 9b and representing the relative positions of the alignment marks 11a and 11b of the wafer 4 with respect to the reference marks 10a and 10b formed on the objective lenses 9a and 9b, the microprocessor 20 shown in FIG. 2 calculates the positional deviation ($\Delta x$, $\Delta y$ and $\Delta\theta$) of the wafer 4 with respect to a reference position which can be represented by the reference marks 10a and 10b of the objective lenses 9a and 9b.

The positional relation (x, y and θ) between the optical axis of the projection lens system 3 and the above-described reference position is predetermined. So, from this predetermined positional relation (x, y and θ) and from the detected positional deviation ($\Delta x$, $\Delta y$ and $\Delta\theta$) described above, the amount of displacement ($x+\Delta x$, $y+\Delta y$ and $\theta+\Delta\theta$) necessary for shifting the wafer 4 so as to place the first shot area of the wafer 4 at the exposure station, i.e. the position under the projection lens system 3, can be determined. Ordinarily, $\theta=0$. And, any rotational error $\Delta\theta$ is corrected by rotationally displacing the wafer chuck 5. If the rotational error is corrected, in this embodiment, the positional errors $\Delta x$ and $\Delta y$ of the wafer 4 in the X and Y directions are measured again by means of the off-axis alignment objective lenses 9a and 9b, after the correction of the rotational error $\Delta\theta$. The amount of displacement of the wafer stage 6 in each of the X and Y directions for bringing the first shot area of the wafer 4 to the exposure station is controlled under the influence of an appropriate one of the laser interferometers 7a and 7b. Also, the step-feeding of the wafer subsequent to the completion of "exposure" relative to the first shot area, for sequentially bringing the second, the third, . . . and the n-th shot areas of the wafer 4 to the exposure station, is controlled in accordance with the measurement by the laser interferometers 7a and 7b. Each time one of the discrete areas of the wafer 4 is positioned at the exposure station under the projection optical system 3, the one area is exposed to the pattern 1a of the reticle 1 with the light from the illumination system 29 (FIG. 2). Thus, the step-feeding and exposure of the wafer are repeatedly effected in the step-and-repeat manner.

The portion of the alignment process in the exposure apparatus of the present embodiment, which has been described in the foregoing, may be similar to the conventional global alignment method. However, the alignment process of the present embodiment has significant features which will now be described fully in the following.

As is well known in the art, a semiconductor integrated circuit is manufactured by superimposingly printing different patterns on the same area of a semiconductor wafer. That is, a first pattern (first-layer pattern) is transferred by an exposure apparatus onto a first "layer" of the wafer and, after various treatment processes such as an etching process and the like, a second pattern (second-layer pattern) is transferred onto a second "layer" overlying on the first-layer pattern already printed on the wafer. Such superposition is repeated. So, in some cases, it may be desired to sequentially use separate exposure apparatuses of different types or of the same type, for the treatment of the same wafer for superimposingly forming different patterns thereon.

As an example, for the sake of pattern transfer relative to the first "layer" of the wafer, one may desire to use a unit-magnification projection exposure apparatus of whole-surface-exposure type which is adapted to transfer, only by one shot (one exposure), plural circuit patterns onto discrete areas of a semiconductor wafer to print, at the same time, plural patterns on the same "layer" of the wafer. In such case, it is possible that the pitch of the patterns printed on the first "layer" of the wafer is not precisely regular, due to distortion in image formation which may be caused by the apparatus's own and peculiar imaging characteristics, temperature changes or the like. In other words, the distance between centers of adjacent patterns printed on the first "layer" of the wafer is not constant in every part of the wafer surface. In such case, if a step-and-repeat type exposure apparatus as in the present embodiment is used for the sake of pattern transfer relative to the second "layer" of the wafer so as to superimposingly print second-layer patterns on the first-layer patterns in a step-and-repeat manner, and where the amount of step-feeding of the wafer for bringing each of the discrete shot areas of the wafer to the exposure station is constant, there would be caused an overlay error between each of the first-layer patterns already printed on the wafer and the image of the second-layer pattern which is being projected onto the first-layer pattern. Such overlay error disadvantageously affects against the property of the semiconductor device, as a product, as well as yields of semiconductor devices.

If, on the other hand, two or more exposure apparatuses of the same step-and-repeat type are used for the treatment of the same wafer so as to superimposingly printing different patterns onto different "layers" of the wafer, there is a possibility of occurrence of such overlay error as described above. This is because, in most cases, there exists a difference in the amount of wafer displacement (step-feeding) due to the difference in the kinetic characteristics between individual wafer stages of the separate exposure apparatuses, even they are of the same type, and/or the difference in the surface precision between individual mirrors of laser interferometer systems used in the separate exposure apparatuses.

In addition thereto, there is a possibility of occurrence of such overlay error as described above, because of any deformation of the wafer due to the effect of a heat cycle or an etching operation during the semiconductor device manufacturing processes.

The above-described problem of occurrence of overlay errors can be substantially obviated or alleviated by the alignment process in the exposure apparatus of the FIG. 1 embodiment.

More particularly, according to the present embodiment, the following operations are preparatorily effected by an operator or in response to instructions from the operator, so as to suppress the overlay error. In the first aspect of the present embodiment, as will be understood from the following description, any error in the step-feeding for the wafer due to the peculiarities of the apparatus can be corrected.

(1) A reticle having a desired pattern is placed on the reticle stage 2.

(2) A desired value (e.g. 15 mm) as the amount of step-feeding is set; a reference wafer is introduced into the apparatus is set; and the pattern transfer operation in the step-and-repeat manner is effected so as to print images of the reticle pattern onto discrete areas of the reference wafer, with no correction being made to the amount of stepwise movement. The reference wafer has satisfactory flatness and is stable against temperature changes. The reference wafer is coated with a photoresist material, and no pattern has not yet been printed thereon.

(3) The position of each of the patterns printed is detected by the above exposure operation on the reference wafer, by use of the two-dimensional coordinate reader 26.

(4) Positional errors $\Delta x$ and $\Delta y$ are detected by calculation, in the X and Y directions of the detected position of each of the patterns printed on the wafer, with respect to corresponding one of target positions (the positions detectable by calculation) which are determined in accordance with the set value (15 mm in this case) for the stepwise movement.

(5) A function from the detected errors $\Delta x$ and $\Delta y$ for stepwise movement in relation to each shot area is fabricated according to a least square method.

(6) The data on the thus prepared function is input into the apparatus by use of the keyboard 12, and store the data into the memory (RAM) 14 of the control unit.

Subsequently, to prepare for transfer of an actual circuit pattern, the following operation is carried out by the operator:

(7) The keyboard 12 is handled to input, into the apparatus, the data about a desired amount of step-feeding (x0, y0) for the transfer of the actual circuit pattern in the step-and-repeat manner.

In response to the input of the data on the amount of step-feeding (x0, y0), the following operation is effected in the apparatus:

(8) Target positions for the pattern tranfer with respect to all the shots are calculated in accordance with the input set value (x0, y0). Also, by using the function stored in the random access memory 14, expected positional errors $\Delta x$ and $\Delta y$ for each of the shots with respect to corresponding one of the target positions are calculated. The thus obtained "expected" errors $\Delta x$ and Δy are stored into the random access memory 23 in the form of a table, described in the foregoing.

Upon the transfer operation for the actual circuit pattern, the following operation is carried out in the apparatus:

(9) The positional errors Δx and Δy related to a particular shot are read out from the table in the random access memory 23 when the particular shot is going to be placed at the exposure station, and the wafer stage 6 is displaced by an amount corresponding to the sum of the set value (x0, y0) and the predicted positional deviation (Δx, Δy), i.e. by an amount "x0+Δx; y0+Δy", whereby the particular shot of the wafer can be accurately brought to the exposure station.

With the above-described operations (1)–(9), the peculiarity in the step-feeding characteristics of the present exposure apparatus is detected and corrected. If these operations are carried out for each of separate exposure apparatuses of step-and-repeat type, which are desired to be used for the treatment of the same wafer, the overlay error described in the foregoing can be substantially completely avoided.

Figure 3:
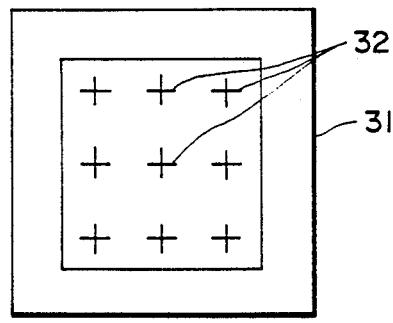
FIG. 3 is a plan view schematically showing an example of a reticle suitable for use with a reference wafer, in the exposure apparatus of the FIG. 1 embodiment.

FIG. 3 shows an example of a reticle suitably usable with the above-described reference wafer. The reticle shown in FIG. 3 comprises a glass plate 31 which is made of quartz and is formed on its surface with nine (9) marks 32 to be used for the detection of any peculiarity of the step-feeding characteristics of the exposure apparatus. While nine marks are formed on the reticle 31 in this example, only one mark is sufficient for the sake of intended detection. However, provision of plural marks is desirable in consideration of possible erasing of some of the marks due to scratches on the reference wafer or on the photoresist layer applied to the surface of the reference wafer, or due to exposure conditions, developing conditions or other conditions.

As is known in the art, the two-dimensional coordinate reader of the type described in the foregoing has a mark discriminating function and, therefore, it easily discriminates or recognizes a desired one out of different patterns. So, without use of a special reticle such as shown in FIG. 3, it is possible to detect any peculiarity in the step-feeding characteristics of the apparatus. That is, a step-and-repeat pattern transfer operation is first effected by use of an ordinary reticle having an actual circuit pattern and, after development, the pattern position detection is effected by the two-dimensional coordinate reader with a particular mark or pattern portion in the actual circuit pattern being designated by the operation.

While the marks 32 for the position detection may be formed at any positions on the reticle, preferably they are formed in an internal portion of the reticle pattern area in consideration of the detection accuracy.

Figure 4A:
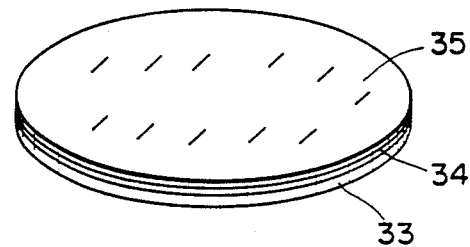
FIG. 4A is a perspective view schematically showing an example of a reference wafer suitably usable in the exposure apparatus of the FIG. 1 embodiment.
Figure 4B:
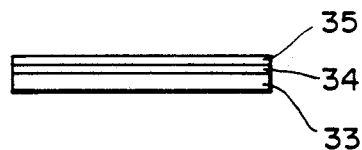
FIG. 4B is a sectional view of the reference wafer shown in FIG. 4A.

FIGS. 4A and 4B show an example of the above-described reference wafer, wherein FIG. 4A is a perspective view and FIG. 4B is a sectional view. In this example, the reference wafer comprises a substrate or base plate 33 made of quartz. One of the surfaces of the base plate 33, facing the projection optical system 3 (FIG. 1) when the wafer is placed on the wafer stage 6, is coated with a chromium layer 34 by vacuum deposition or the like, and a photoresist layer 35 is formed on the chromium layer 34. The chromium layer 34 is provided to facilitate easy observation of patterns after they are printed on the wafer.

Important features of the present embodiment will be summarized in the following:

According to a first feature of the present embodiment, the positions of the patterns printed on a "certain" reference wafer are preparatorily measured and, thereafter, the positional deviation between each of the detected positions of the patterns printed on the reference wafer and corresponding one of target or aimed positions determined by a set step-feed displacement and obtained by calculation is preparatorily detected by calculation. Upon the subsequent step-and-repeat pattern transfer operation for transferring an actual circuit pattern, the wafer stage is moved in the step-and-repeat manner to sequentially step-feed the wafer, while the amount of each step-feed movement (the movement to bring each shot to the exposure station) is corrected by an amount corresponding to the detected positional deviation. According to this feature of the present embodiment, the pattern overlay error can be satisfactorily suppressed in the zone alignment process and in the global alignment process. Also, if the present embodiment is applied to an exposure apparatus of the type in which the die-by-die alignment method is employed, the accuracy of placement by the step-feeding itself is improved. As a result, in the die-by-die alignment process, the time necessary for the alignment is reduced which advantageously increases the through-put.

In one aspect of the above-described first feature of the present embodiment, it will be understood from the foregoing that, where a quartz wafer such as shown in FIGS. 4A and 4B which has satisfactory surface flatness and is stable against temperature changes is used as the "reference wafer" and if any patterns are printed on the reference wafer in the step-and-repeat manner with no correction being made to the amount of step-feeding of the wafer, any peculiarily in the kinetic characteristics of the X—Y stage of the used exposure apparatus can be detected. And, from the results of pattern printing, representing the peculiarity, the amount of necessary correction for the step-feeding by the X—Y stage can be determined. So, the pattern overlay error which may be caused "peculiarity" of the present exposure apparatus can be satisfactorily suppressed.

It is possible to use one of the semiconductor wafers in a certain lot, having been subjected to one or more predetermined manufacturing processes, as the above-described "reference wafer". That is, by detecting the positions of patterns printed on the selected wafer which may include deformation due to the preceding processes, the amount of correction for the step-feed displacement, such as described above, can be determined. By correcting the step-feed displacement for the subsequent step-and-repeat pattern transfer operation relative to the next "layer", the pattern overlay error due to the irregular pitch (caused by the wafer process) of the patterns already printed on the wafer can be satisfactorily suppressed.

Also, it will be understood that, where the amount of correction described above is detected from the information about the positions of patterns printed on a certain wafer, having been processed by a separate exposure apparatus of step-and-repeat type or of the type in which all the areas of the wafer are exposed by one shot, the pattern overlay error which may otherwise be caused by the peculiarity in the step-feed characteristics or the distortion during the image formation by the "one shot" (chiefly because of optical characteristics of an optical system used), can be satisfactorily avoided.

According to a second feature of the present embodiment, the differences between the actually detected values concerning the printed-pattern positions and the values concerning the target or aimed positions and obtained by calculation are stored in the form of an approximation function related to the positional error, with respect to each of the shot areas. That is, once detection of positional errors is actually carried out with respect to a "certain" reference wafer having a certain pitch of patterns defined thereon, it is possible to obtain or predict, only by calculation using the function, data about positional errors with respect to any actual circuit patterns having any different pitch (the amount of step-feeding).

In accordance with a third feature of the present embodiment, once a particular amount of step-feed displacement for the step-and-repeat pattern transfer operation for an actual circuit pattern is set, the target positions for respective shot areas on the wafer (more particularly, the positions of shot areas relative to the position of the first shot area) are calculated. Subsequently, by using the above-described function concerning the positional error, the amount of error of each of "expected" pattern transfer positions with respect to corresponding one of the target positions for the shot areas is calculated. That is, the amount of positional error is predicted. The data obtained by calculation is stored into the memory in the form of a table. This is very advantageous because, upon the transfer operation of the actual circuit pattern, an undesirable increase in the time for correcting the positional deviation, resulting from the calculation of the amount of positional error, can be prevented and, thus, an undesirable decrease in the throughput can be avoided.

Figure 5:
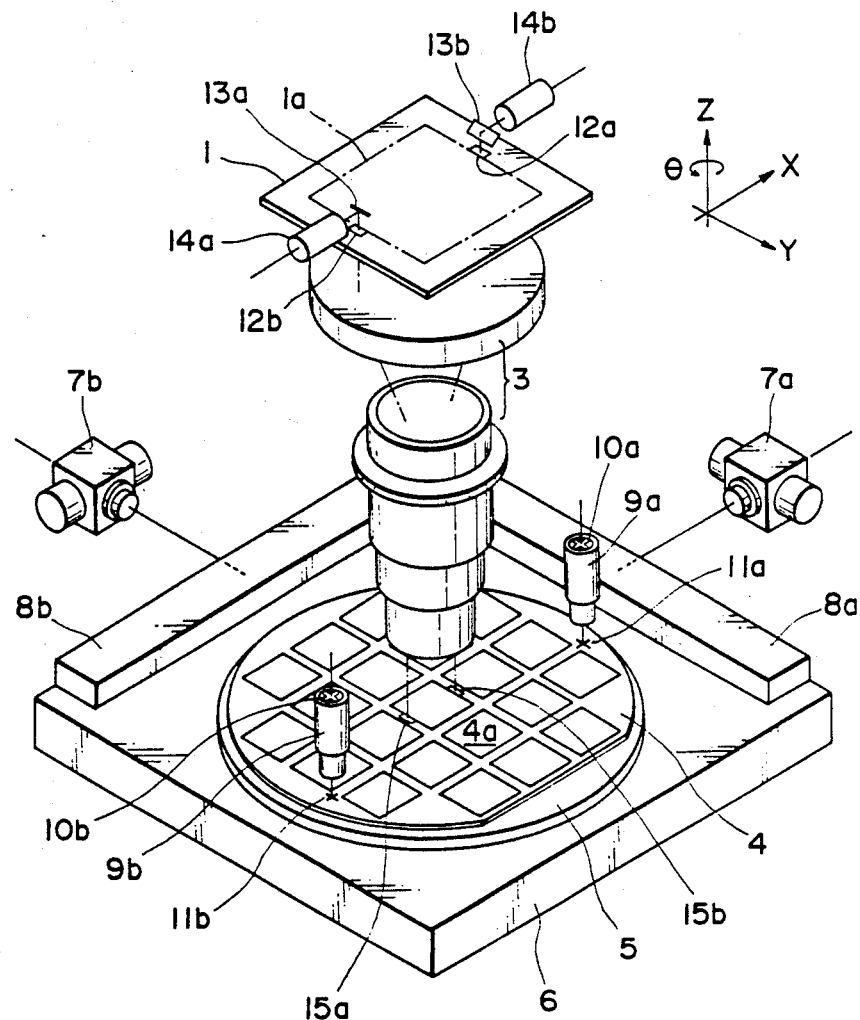
FIG. 5 is a schematic and perspective view showing an exposure apparatus according to another embodiment of the present invention.

Referring now to FIG. 5, another embodiment of the present invention will be described. Elements of the present embodiment having similar or corresponding functions as of those of the FIG. 1 embodiment are denoted by the same reference numerals.

In FIG. 5 embodiment, the invention is applied to a step-and-repeat type exposure apparatus having a TTL (through the lens) alignment detecting function. Denoted by numeral 1 is a reticle having a circuit pattern 1a formed on its lower surface. Also, mark areas 12a and 12b are defined on the reticle 1. In these mark areas 12a and 12b, alignment marks (not shown) are formed. These alignment marks are used for the sake of TTL alignment which is known per se. The exposure apparatus includes a known type TTL detecting system 16 which is diagrammatically shown in FIG. 6 and include a pair of objective lenses 14a and 14b. These objective lenses 14a and 14b are adapted to observe or detect the alignment marks formed in the regions 12a and 12b on the reticle 1 and also to observe or detect, by way of a projection lens 3, alignment marks formed on mark areas 15a and 15b, respectively, defined on each of discrete shot areas 4a of a wafer 4. By detecting the reticle alignment marks and the wafer alignment marks with the objective lenses 14a and 14b, any positional deviation between the reticle 1 and one of the shot areas 4a of the wafer 4, being observed, is detected in the TTL alignment detecting system 16 in a known manner. The exposure apparatus further includes mirrors 13a and 13b which are provided to bend the optical axes of the objective lenses 13a and 13b, respectively. These mirrors 13a and 13b are swingable, such that, while they are at the illustrated positions during the alignment operation, they are rotationally moved about a Y-axis and retracted from the path of light from an illumination system 29 (see FIG. 6) during the exposure operation.

Figure 6:
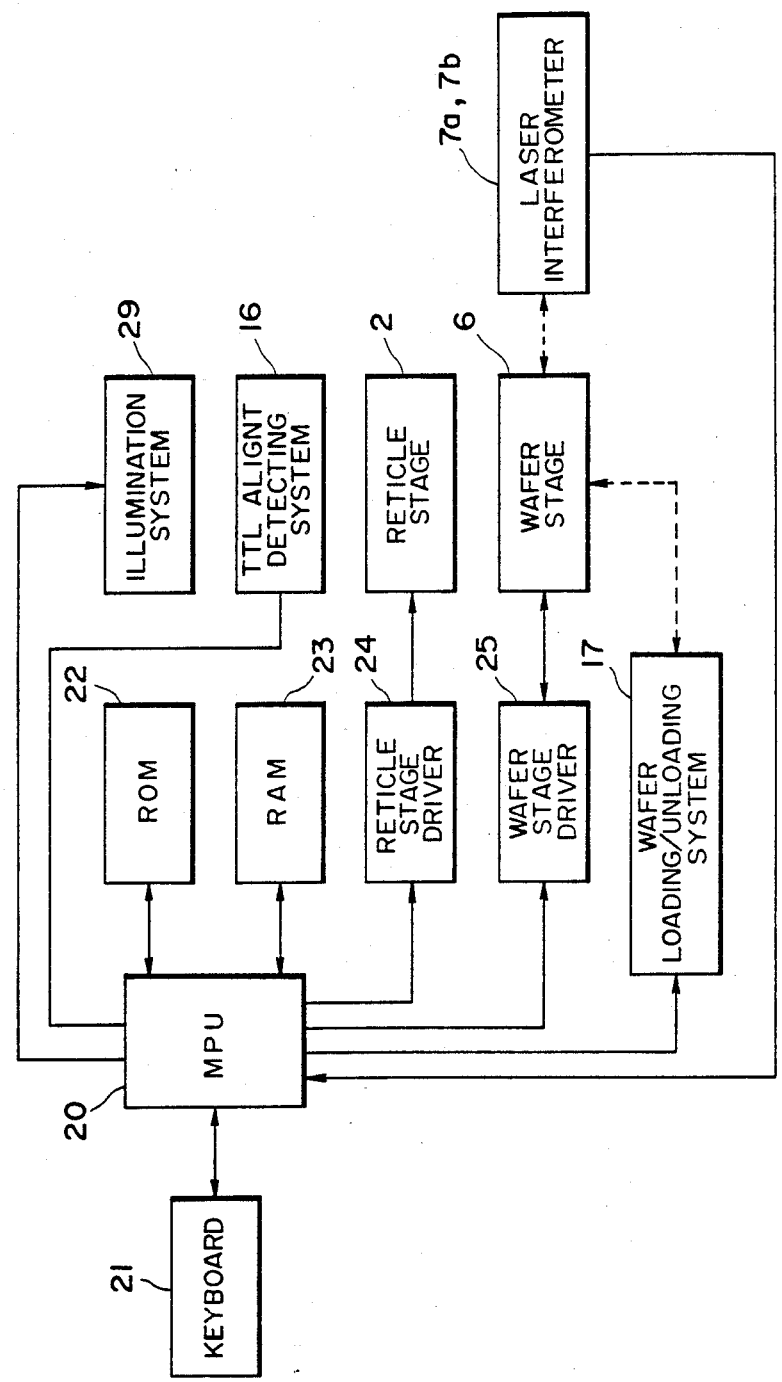
FIG. 6 is a block diagram showing the arrangement of a control system used in the FIG. 5 embodiment.

FIG. 6 shows an arrangement of a control system used in this embodiment. In FIG. 6 arrangement, denoted by numeral 27 is a wafer loading/unloading system of known type, which is adapted to load or unload the wafer 4 onto or from a wafer chuck 5. In this embodiment, the control system includes a random access memory (RAM) 23 which is similar to the memory 23 shown in FIG. 2. However, in the present embodiment, the random access memory 23 has an additional area such as a global alignment flag which is operative upon transition to a global alignment mode from a die-by-die alignment mode, as will be described later. The TTL alignment detecting system 16 is arranged to detect, during the die-by-die alignment mode, the alignment marks of the reticle 1 and the alignment marks of one of the shot areas 4a of the wafer, which is being placed at the exposure station, thereby to detect any positional deviation of that shot area of the wafer with respect to the reticle 1. The detection of positional deviation is made by using the light reflected from the marks. In the die-by-die alignment mode, the wafer chuck 5 and a wafer stage 6 are moved respectively in accordance with the result of detection by the TTL alignment detecting system 16, so that the positional deviation between the reticle 1 and the "current" shot area of the wafer 4 comes into a predetermined tolerance.

Figure 7A:
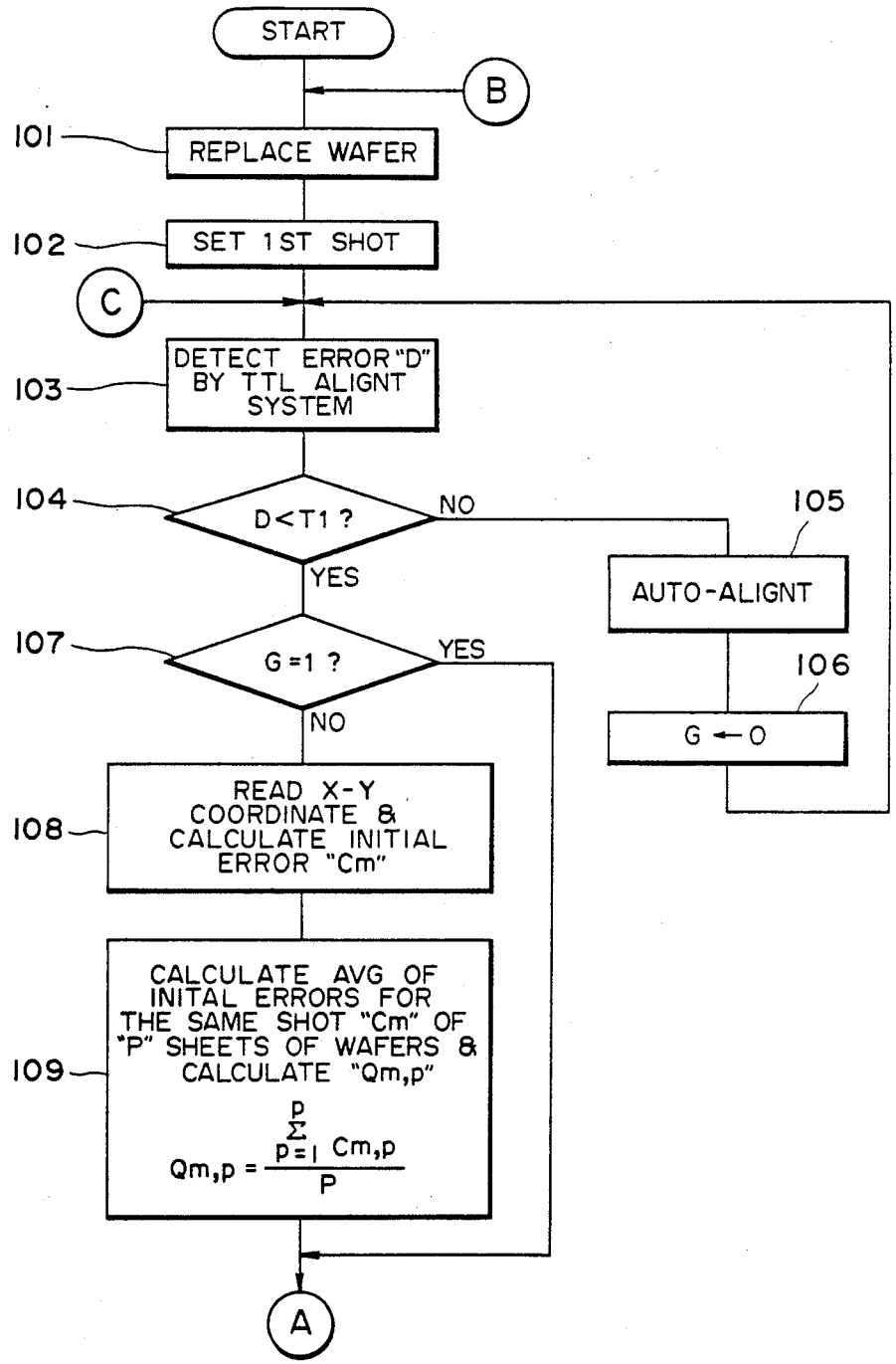
FIGS. 7A and 7B are flow charts showing the flow of operation of the FIG. 5 embodiment.
Figure 7B:
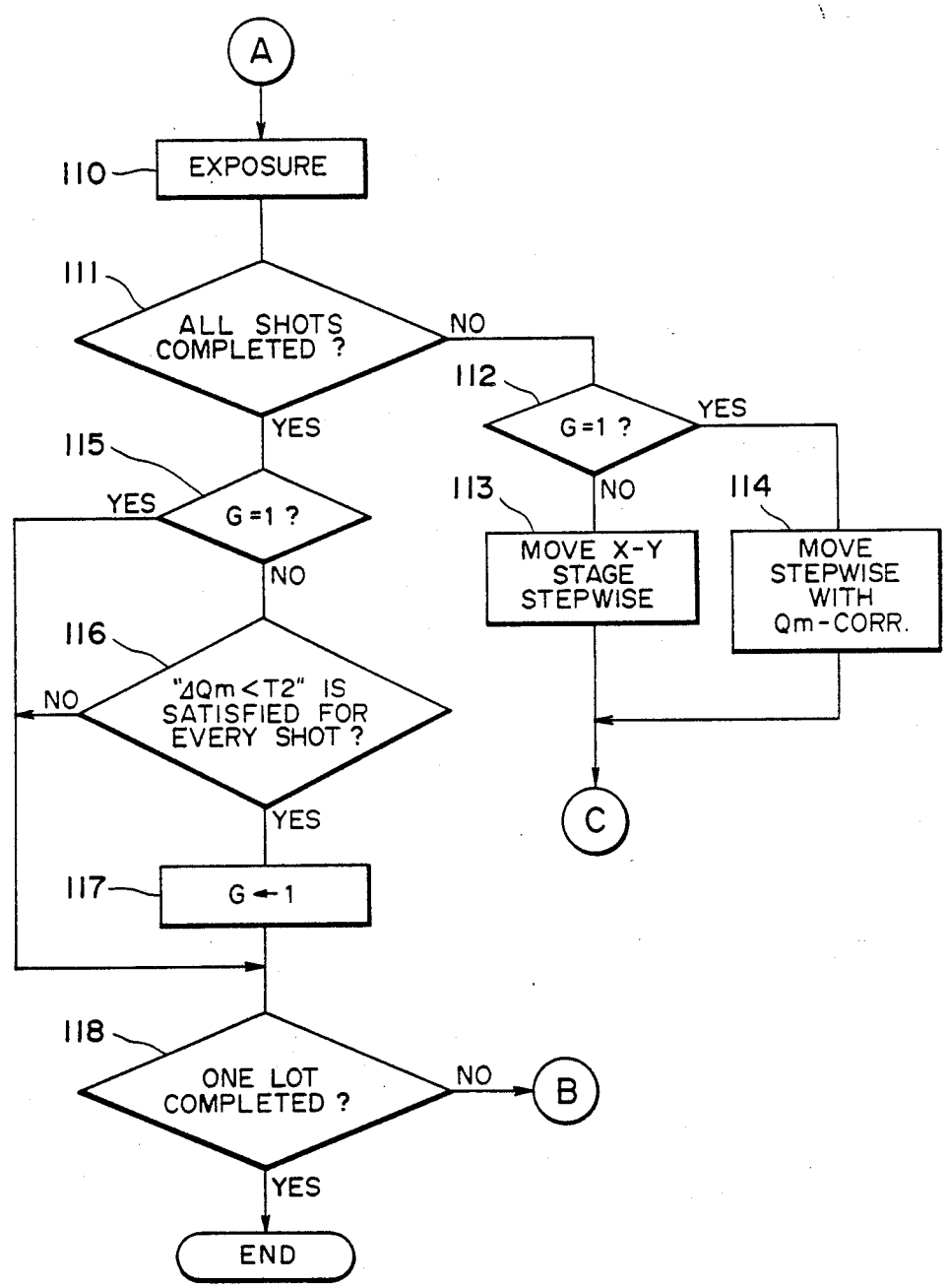

The operation of the exposure apparatus of the present embodiment will now be described, taken in conjunction with a flow chart of FIG. 7.

First at Step 101, a new wafer 4 is placed on the wafer chuck 5 by means of the wafer loading/unloading system 17. Then, at Step 102, the wafer 4 is moved so that the first shot area of the wafer is placed at the exposure station under the projection lens system 3. More particularly, with the aid of an unshown mechanical prealignment system, the wafer 4 is placed on the wafer chuck 5 with a positional error of an order not greater than 0.1 mm so that prealignment marks (not shown) formed on the wafer 4 come into a viewfield of an unshown TV prealignment microscope. After the wafer 4 is placed on the wafer chuck 5, TV prealignment is effected by detecting the prealignment marks of the wafer 4 through the TV prealignment microscope. If, at this time, the die-by-die alignment mode is designated in the exposure apparatus, the wafer 4 is moved in accordance with the result of position detection by the TV prealignment microscope so that the first shot area of the wafer 4 is accurately placed at the position under the projection lens system 3 with a positional error of an order not greater than ±10 microns. If, on the other hand, the TTL global alignment mode is designated, predetermined two shot areas on the wafer 4 are subjected to the position detection operation, using the projection lens system 3. From the results of position detection, the positional error of the wafer 4 as a whole is detected. The two-point detection, i.e. the position detection with respect to two shot areas on the wafer, is effective to more accurately detect the rotational deviation or error $\Delta\theta$ of the wafer 4 as a whole. The positional relation between the first shot area and the two shot areas having been subjected to the position detecting operation is predetermined. So, from this positional relation and from the detected positional error of the wafer 4 as a whole, the amount of displacement for accurately placing the first shot area of the wafer 4 at the position under the projection lens system 3 can be calculated.

Usually, the rotational error of the wafer 4 as a whole is corrected by rotating the wafer chuck 5. The displacement of the wafer stage 6 for placing the first shot area of the wafer 4 at the exposure station is controlled while monitoring the displacement by use of laser interferometers 7a and 7b.

At Step 103, the TTL alignment detecting system 16 is operated to detect any alignment or overlay error ($\Delta x$, $\Delta y$ and $\Delta \theta$) of the image of the pattern 1a of the reticle 1, being projected by the projection lens system 3, with respect to a pattern or patterns already printed in the "current" shot area (the shot area being placed at the exposure station) of the wafer 4. Then, at Step 104, the thus detected alignment error, as represented by "D" in FIG. 7, is compared with a predetermined tolerance T1. If within the tolerance, the sequence proceeds to Step 107. If not within the tolerance, the sequence proceeds to Step 105 in which the position of the wafer 4 relative to the reticle 1 is adjusted (automatic alignment). And, after the global alignment flag G is reset (Step 106), the sequence goes back to Step 103. The auto-alignment operation at Step 105 is effected by correcting an X-Y error with the aid of the wafer stage 6 and by correcting $\theta$ (rotational) error with the aid of the reticle stage 2 and/or the wafer chuck 5.

When the sequence reaches Step 107, the content of the global alignment flag G is checked. If the global alignment flag G has been reset, the sequence proceeds to Step 108 because "reset" means that the die-by-die alignment mode has been designated in the apparatus. If, on the other hand, the flag G has been set, the sequence skips Steps 108 and 109, because "set" means that the global alignment mode has been designated in the apparatus. So, the sequence directly goes to Step 110 at which the exposure is effected with the aid of the illumination system 29.

During the die-by-die alignment mode in the Step 108, the coordinate of the position of the current shot area after completion of alignment is read from the result of measurement by the laser interferometers 7a and 7b. And, from the thus read coordinate of the current shot position and from the final alignment error D (<T1), the difference Cm between the target position and the position of the pattern already printed on the current shot area, which difference was established just at the time of completion of the step-feeding of the wafer for the current shot, is detected. This detection of positional difference Cm is repeated for the same shots (m-th shots) of different wafers. Then, at Step 109, an average of differences Cm of the same m-th shot areas of the different wafers is calculated, as a "new" amount of correction (Qm,p). Alternatively, such new amount of correction Qm,p may be obtained from the following equation:

$$Q_{m,p} = \{(P-1)Q_{m,p-1} + C_m\}/P$$

wherein Cm is the difference, as aforesaid, of the current m-th shot area of the "current" wafer and Qm,p−1 is the amount of correction with respect to the same m-th shot areas of the "preceding" wafers.

Further, in Step 109, the difference $\Delta Q_m$ between the "old" amount of correction Qm,p−1 and the "new" amount of correction Qm,p is calculated. Then, at Step 110, the pattern is transferred onto the current shot area. Subsequently, at Step 111, whether or not all the shots of one wafer are completed is discriminated. If not completed, the sequence proceeds to Step 112. If completed, the sequence proceeds to Step 115. At Step 112, the global alignment flag G is checked so as to determine the manner of wafer feeding with respect to the next shot. That is, if the global alignment flag G is in the reset state (which means that the die-by-die alignment mode has been designated), the wafer stage 6 is moved stepwise (Step 113) toward the target position for the next shot area. If, on the other hand, the global alignment flag G is in the set state (which means that the global alignment mode has been designated), sequence proceeds to Step 114, such that the wafer stage 6 is moved stepwise while aiming at such position that is displaced from the target position for the next shot area by an amount equal to the above-described value Qm,p. Then, the sequence goes back to Step 103 and the above-described operations are repeated.

If the exposures relative to all the shot areas of one wafer are completed, the sequence proceeds to Step 115. In this Step 115, the global alignment flag G is checked. If it is in the set state, the sequence goes to Step 118. If the flag G is in the reset state, the sequence goes to Step 116. At Step 116, discrimination is made about whether or not, for every shot area, the above-described difference $\Delta Q_{m,p}$ is within a predetermined tolerance T2. If this is satisfied, the global alignment flag G is set (Step 117). If, on the other hand, the tolerance T2 is not satisfied with respect to any one of the shot areas, the sequence proceeds to Step 118. At Step 118, whether or not all the wafers in one lot has been processed is discriminated. If the process for all the wafers of one lot is completed, the operation is finished. If not so, the sequence goes back to Step 101, and the above-described operations are effected relative to the next wafer.

Details of the sequence for processing plural wafers will now be described.

At the first time, a first wafer is placed on the wafer chuck 5 and the first shot area of the wafer is positioned at the exposure station. Since the positional errors relative to the target positions are not yet detected, with respect to the first wafer, the global alignment flag G is kept in the reset state and the positioning of each shot area is effected according to the die-by-die alignment process. During such positioning for each shot area, the deviation Cm from the corresponding target position is detected. And, the thus detected deviation Cm is used as the amount of correction Qm,1.

The second wafer is processed in the similar manner. However, at Step 109, an average Qm,2 with respect to the value Qm stored in the memory 23 and the value Cm just detected with reference to the second wafer, is calculated by the microprocessor 20. This average Qm,2 is used as the "new" amount of correction, and is stored into the memory 23. Also, the difference $\Delta Q_{m,2}$ between the values Qm,1 and Qm,2 is calculated. Thereafter, the exposure is effected and, then, similar operations are effected relative to the remaining shot areas. If, for plural wafers, there is a tendency in respect to the positional deviation of patterns printed in the preceding processes, the value of difference $\Delta Q_{m,p}$ becomes smaller with an increasing number of wafers, processed, in the same lot. Therefore, each time the treatment for one wafer is completed, the differences $\Delta Q_{m,p}$ for all the shot areas are examined (Step 116). If every one of the differences $\Delta Q_{m,p}$ is less than the predetermined tolerance T2, this implies that, for the plural wafers, the deviation between the target position and the position of the pattern being projected, after completion of alignment, is less fluctuated. Accordingly, the global alignment flag G is set, so that the alignment mode is changed to the global alignment mode based on the above-described TTL global alignment detection or on the off-axis global alignment detection using the objective lenses 9a and 9b. In the global alignment mode, and upon the step-feeding of the wafer stage, calculations are made to detect the amount of displacement necessary for moving the wafer 4 aiming at a position which is displaced from the target position by an amount equal to the calculated amount of correction Qm,p. And, on the basis of this calculation, the wafer stage 6 is moved stepwise.

Important features of the present embodiment will now be summarized in the following.

In this embodiment, where plural wafers of one lot are to be treated, the positioning or alignment of each of shot areas of the first wafer is effected according to the die-by-die alignment method. At this time, the amount of alignment for each shot area, that is, the difference Cm from the corresponding target position determined by the set amount for step-feed is detected. And, on the basis of the thus detected amount Cm, the amount of expected deviation of the same shot area of the next wafer, that is the amount of correction for the step-feed for placing that shot area of the next wafer is calculated. If the amount of correction obtained in the foregoing manner is stabilized or becomes constant, the alignment mode is changed to the global alignment mode using the amount of correction as above.

It will be understood from the foregoing that the exposure apparatus of the present embodiment has an automatic "learning" function effective to detect the tendency of positional deviations of the shot areas on plural wafers, caused by the peculiarity of the step-feeding characteristics, process errors, etc. Such learning function allows transition of alignment mode from the die-by-die alignment mode to the global alignment mode and also allows correction, in the global alignment mode, for the amount of step-feed with respect to each shot area on the basis of the amount of correction calculated from the tendency of positional deviations detected with reference to the preceding wafers. In accordance with such features of the present embodiment, it is possible, for the wafers of the same lot to be subjected to a batch treatment, to improve the throughput without degrading the pattern overlay accuracy, provided that there is a tendency in respect to the positional deviation from the target position, in relation to the same shot areas of the plural wafers. Also, the pattern overlay error due to the difference in the kinetic characteristics of individual X—Y stages of separate exposure apparatuses can be automatically corrected according to the above-described learning function of the present embodiment. Accordingly, it is possible that the TTL alignment is accomplished with a decreased number of position adjusting operations. Further, where the amount of correction as described above less fluctuates, accurate pattern overlay is attainable relative to such a shot area to which the automatic alignment is not possible.

While in the present embodiment, the value Qm,p is detected as an average of the differences Cm between the target position and the positions of the same shot areas m of different wafers, this may be obtained by weighting according to the number of wafers treated, such as follows:

$$Q_{m,p} = (1-R) \cdot Q_{m,p-1} + R \cdot C_m \quad (R \leq 1/P)$$

In this case, if $R = 1/P$, the value Qm,p is equal to an average of the differences Cm, as in the present embodiment. Also, while in the foregoing the automatic learning function with respect to the positional errors in the X and Y directions has been described, a similar learning function with respect to a positional error in the $\theta$ direction is attainable in essentially the same manner.

In the present embodiment, even after transition to the global alignment mode, discrimination is made (Step 103 and 104) for each shot area, as to whether the overlay error is within the tolerance or not. However, to further improve the throughput, this discrimination may be made once for plural shot areas or for plural wafers. Moreover, this discrimination itself may be omitted. If omitted, it will be possible to effect the pattern transfer operation relative to such shot area to which the automatic alignment is not attainable for some reason such as erasing of alignment marks.

In addition, the sequence may be modified in the following manner:

When, in the die-by-die alignment mode, the wafer stage is to be moved stepwise for the next shot area after completion of exposure of the "current" shot area (Step 110), the amount of displacement of the wafer stage is corrected so as to move the next shot area to a position displaced from the corresponding target position by an amount equal to the above-described amount of correction. In such case, the Steps 112 and 113 will be omitted.

The embodiment shown in FIG. 1 and described in the foregoing may be modified in various ways. For example, while in the FIG. 1 embodiment the approximation function obtained by calculation is manually input into the apparatus from the keyboard 21, the system may be arranged such that the approximation function is stored into the read-only-memory 22 in the form of a general formula. In such case, it is sufficient for the operator to input a coefficient only, into the apparatus by handling the keyboard 21. Moreover, the system may be arranged so as to effect, within the apparatus, a portion of or all of the calculations which are made by the operator in the FIG. 1 embodiment. If such modification is made, it is sufficient for the operator to input only the data necessary for effecting the calculation, into the apparatus by handling the keyboard 21. Further, the output of the two-dimensional coordinate reader 26, representing the result of measurement, may be supplied to the non-volatile memory 27 to be stored therein, such that upon start of the exposure apparatus or upon resetting the apparatus, the data stored in the memory 27 is automatically read by the microprocessor 20, whereby the above-described calculations for detecting positional errors of patterns, approximation function, errors in the step-feeding of the stage and the like are effected automatically.

While the invention has been described with reference to the structures disclosed herein, it is not confined to the details set forth and this application is intended to cover such modifications or changes as may come within the purposes of the improvements or the scope of the following claims.

What is claimed is:

1. An alignment method for use in a step-and-repeat alignment and exposure apparatus, said method comprising the steps of:
    detecting positional errors of patterns on a first wafer, in relation to stepwise movement of a wafer stage;

preparing an approximation function related to the positional errors of the patterns of the first wafer, by using a least square rule;

determining, by using a data related to the approximation function and a data related to a second wafer, a data concerning stepwise movement of the wafer stage to be made for step-and-repeat exposure of the second wafer; and controlling the stepwise movement of the wafer stage upon step-and-repeat exposure of the second wafer, on the basis of the determined data.

2. A method according to claim 1, wherein the first wafer is made of a quartz material and the second wafer is made of a semiconductive material.

3. A method according to claim 1, wherein the prepared approximation function is memorized in a memory provided in the exposure apparatus.

* * * * *